United States Patent [19]

Rank et al.

[11] 4,318,157
[45] Mar. 2, 1982

[54] APPARATUS FOR MOUNTING CIRCUIT CARDS

[75] Inventors: William J. Rank, Minneapolis; Michael J. Whalen, Rosemont, both of Minn.

[73] Assignee: Control Data Corporation, Minneapolis, Minn.

[21] Appl. No.: 156,967

[22] Filed: Jun. 6, 1980

[51] Int. Cl.³ ............................................ H05K 7/20
[52] U.S. Cl. .................................. 361/386; 361/388; 339/75 MP
[58] Field of Search .................... 211/41; 174/16 HS; 339/17 R, 17 L, 17 LC, 17 LM, 17 M, 75 MP; 361/381, 382, 383, 386, 388, 399, 415; 165/80 R, 80 A, 80 B, 80 D

[56] References Cited

U.S. PATENT DOCUMENTS

| | | | |
|---|---|---|---|
| 1,217,539 | 2/1917 | Underwood | 254/42 |
| 3,631,325 | 12/1971 | Wenz | 361/386 |
| 3,845,359 | 10/1974 | Fedele | 361/415 |
| 3,848,953 | 11/1974 | Petroshanoff | 361/415 |
| 3,853,379 | 12/1974 | Goodman | 361/415 |
| 3,922,051 | 11/1975 | Reynolds | 361/413 |
| 4,120,021 | 10/1978 | Roush | 361/386 |
| 4,157,583 | 6/1979 | Basmajian | 361/415 |

*Primary Examiner*—Gerald P. Tolin
*Attorney, Agent, or Firm*—Frederick W. Niebuhr; Joseph A. Genovese

[57] ABSTRACT

Apparatus is disclosed for removably mounting a printed circuit card to a chassis adapted to support an array of circuit cards. Two jackscrews are rotatably mounted to each circuit card by a bracket at each end of a row of electrical pin contacts. Mounted to the chassis at each end of a row of female electrical contacts is an anchor with a jackscrew-receiving opening. Insertion of the jackscrews into the anchors aligns the pin and the female contacts and turning of the jackscrews into the anchors then causes the pin and female contacts to electrically engage. Each jackscrew carries an internally threaded crown and a plurality of ramps between the crown and bracket. Each ramp is movable longitudinally of the jackscrew and also laterally by virtue of a bore therethrough larger in diameter than the jackscrew. The crown is movable toward and away from the bracket. Adjacent ramps have oblique and parallel mating surfaces such that crown movement toward the bracket moves adjacent ramps in opposite directions laterally of the jackscrew, urging alternate ramps and the circuit card against opposing channel walls in the chassis to frictionally secure the circuit card in the chassis.

11 Claims, 11 Drawing Figures

APPARATUS FOR MOUNTING CIRCUIT CARDS

BACKGROUND

The circuit card module is a well known form of electric circuit packaging in which a series of individual circuit cards is each removably mounted to a chassis. Each circuit card carries at one end a set of electrical contacts adapted to engage a mating set of contacts mounted to the chassis. The increasing variety of applications for such modules requires improved performance and adaptability to a variety of environments. For example, greater circuit complexity results in an increase in the number of electrical pin contacts, frequently to over one hundred pins per circuit card. The force required for inserting the card into the chassis then can exceed one hundred pounds. Along with the greater insertion force, there remains the need for insertion accuracy since the contact pins individually are delicate and susceptible to bending or breakage. One method of accommodating the insertion requirement is shown in U.S. Pat. No. 3,848,953 to Petroshanoff granted Nov. 19, 1974, showing a jackscrew which, when threaded into a guide, brings the male and female contacts of the circuit card and housing together in alignment. Another method is to make at least one set of electrical contacts movable with respect to its carrier, i.e., either the circuit card or the chassis. U.S. Pat. No. 3,853,379 to Goodman et al granted Dec. 10, 1974, is an example of such an approach.

As modules are employed in increasingly hostile environments, the need arises to reduce or eliminate circuit card vibration with respect to the chassis. U.S. Pat. No. 3,922,051 granted to Reynolds, Nov. 25, 1975, shows a wedge driven between a visual display panel and an upper ledge to force a series of contacts against mating contacts in a lower ledge.

Yet another performance requirement of the circuit module is rapid heat dissipation. The individual electrical components generate heat as they dissipate power. Heat buildup is aggravated by the increased density of components upon each circuit card and the density of cards in the chassis. One method of heat dissipation is shown in U.S. Pat. No. 3,845,359 to Fedele granted Oct. 29, 1974, showing a circuit card anchor which includes a heat conducting spring held between ends of a beam and compressable against the side flanges of a chassis wall, thereby to provide improved heat conduction between the circuit card and the chassis walls.

There are particular uses for circuit modules which entail extreme environmental conditions, particularly in the fields of aviation and space exploration. These require yet further improvements in accurate, positive circuit card mounting and heat dissipation. It is an object of this invention, therefore, to eliminate any substantial vibration in the circuit card relative to its chassis. It is a further object of the invention to provide a guide for aligning mating electrical contacts of a chassis and circuit card prior to the actual engagement of the contacts. Yet another object of the invention is to provide a firm mounting of each circuit card within the chassis and maximize the transfer of heat from each circuit card in the chassis.

SUMMARY OF THE INVENTION

To achieve these and other objects, there is provided a means for removably mounting a printed circuit card assembly within a chassis. The chassis includes a base and two opposed walls, each having a plurality of channels. The chassis further includes a row of female electrical contacts mounted to the base and a means for anchoring a shaft mounted to the base proximate each end of the row of female contacts. The printed circuit card assembly includes a heat sink, a printed circuit card mounted to the heat sink, and a mating row of electrical pin contacts mounted to the assembly. The pin contacts are adapted to engage the female contacts of the chassis, thereby to establish electrical contact between the chassis and circuit card. The circuit card assembly further includes a bracket mounted proximate each end of the row of pin contacts.

The means provided for removably mounting the assembly to the chassis include an elongated shaft carried in each bracket. Each shaft is adapted to releasably engage an associated anchoring means in the chassis. Contact between each shaft and its associated anchoring means prior to full engagement aligns said pin contacts with the female contacts. Subsequent movement of each shaft to a full engagement with its associated anchoring means simultaneously causes the pin contacts and female contacts to engage. A plurality of ramps are carried on each shaft and are movable laterally thereof. A forcing means on each shaft urges the ramps laterally toward in opposite directions, and forces at least one of the ramps and the circuit board assembly against opposite wall portions of one of said channels. This frictionally secures the assembly in the chassis.

The preferred shaft is a jackscrew threaded at one end for engagement with an internally threaded anchor mounted to the base and functioning as the receiving means. For each row of female contacts, there are two anchors, one at each end of the row. Similarly, each circuit card has two brackets, each carrying a jackscrew. As the pair of jackscrews are initially inserted, each into its own associated anchor, the circuit card is positioned with respect to the chassis such that the pin contacts are aligned with the female contacts. As the jackscrews are simultaneously threaded into the anchors, they force the pin contacts into the receiving female contacts and also drive each bracket against its associated anchor. The contiguous surface contact between each anchor and bracket provides a positive contact between the circuit card and chassis so that no substantial forces between the chassis and card are resolved through the pin contacts, thus avoiding any damage to the contacts.

Performance is further enhanced through the elimination of any substantial vibration between the circuit card and chassis. This is accomplished through the forcing means, preferably a crown at the top of each jackscrew and movable longitudinally with respect to the jackscrew. The ramps, all positioned between the bracket and crown, are urged toward the bracket by such longitudinal movement of the crown. When the ramps can no longer move longitudinally, further crown movement urges them laterally, forcing at least one of the ramps against one of the channel walls, while ramps driven in the opposite direction force the circuit card heat sink against the opposite channel wall. As the crown is tightened yet further, its longitudinal force is resolved in a high lateral force against the channel walls to securely maintain the circuit card within the chassis. An important feature of the frictional ramp support is that the ramp surfaces contacting the heat sink and channel walls provide a relatively large heat conductive surface from the heat sink to the chassis walls. This increases the conduction of heat away from the circuit card where it is generated, and allows for a relatively dense array of components per circuit card and packing of circuit cards per chassis. This feature is critical whenever space is at a premium.

IN THE DRAWINGS

Other features and advantages will become apparent upon a reading of the following detailed description along with inspection of the drawings in which.

DETAILED DESCRIPTION OF THE PREFERRED EMBODIMENT

Figure 1:
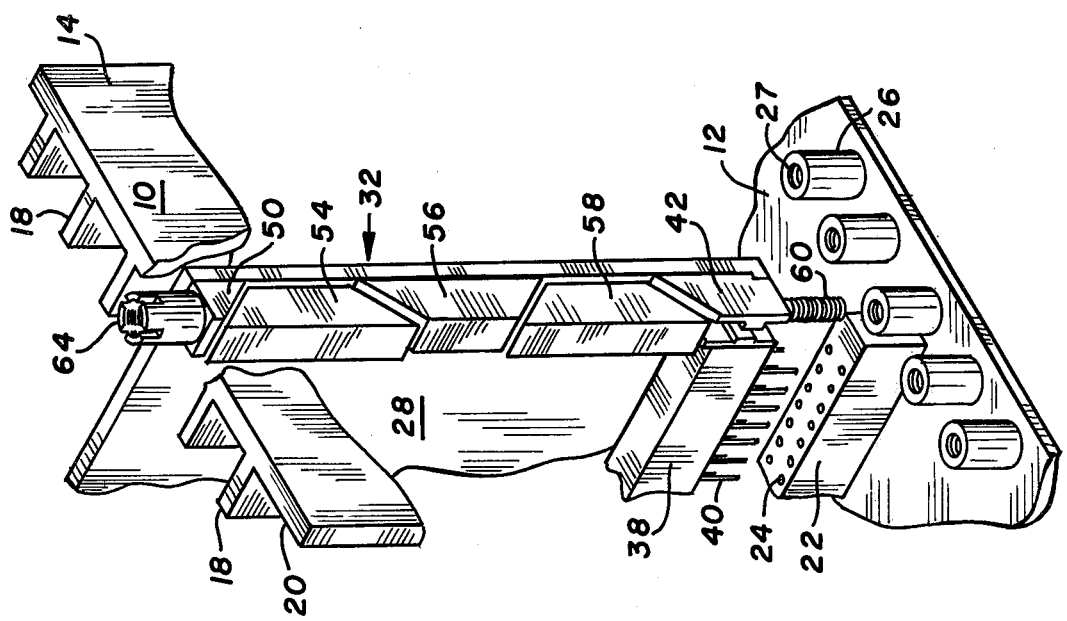
FIG. 1 is a perspective cutaway view of a circuit card positioned in a chassis in accordance with the invention.

Referring to the drawings, there is shown in FIG. 1 a circuit card module including a chassis 10 having a base 12. Attached to base 12 are a first vertical wall 14 and a second vertical wall 16 parallel and opposed to the first wall. A plurality of parallel and upstanding ribs 18 in wall 14 define parallel channels 20. Similarly in wall 16, a plurality of vertical ribs 19 define a series of channels 21. Pairs of ribs 18 and 19 provide opposite channel wall portions against which circuit card assemblies can be supported.

Also mounted to base 12 is a connector housing 22 including a plurality of female contacts 24 forming a row of contacts spanning the width of chassis 10. While only one housing is shown in the figure, it is understood that chassis 10 can include a number of such housings to form a series of parallel rows of female contacts. Adjacent to housing 22 at one end tereof and proximate wall 14 is an anchor or jacking nut 26. Although not shown, there is a substantially identical anchor at the other end of housing 22 near second wall 16. Each anchor has an internally threaded opening 27.

Mounted in chassis 10 is a circuit card assembly 28 including a heat sink 30 spanning the distance between walls 14 and 16. A first fastener 32 and a second fastener 34, attached to heat sink 30, mount the heat sink between neighboring ribs in channels 20 and 21, respectively, to firmly position assembly 28 with respect to chassis 10. The assembly further includes a printed circuit card 36 mounted to the heat sink. Also mounted to the heat sink is a circuit card housing 38 having a plurality of pin contacts 40 arranged in a row and adapted for electrical contact with female contacts 24. A bracket or jacking block 42 is mounted to heat sink 30 at the end of housing 38 proximate first wall 14. Similarly (not shown) a second bracket is mounted at the other end of the row adjacent second wall 16. Each bracket is permanently mounted to the heat sink by first and second rivets; e.g., 44 and 46 for mounting bracket 42.

Figure 4:
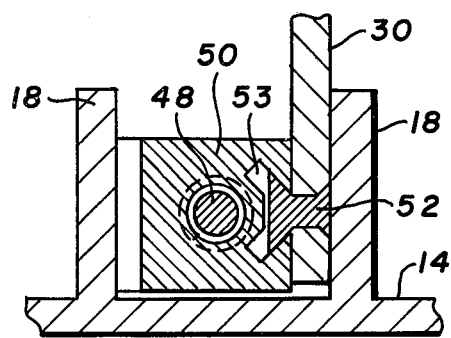
FIG. 4 is a sectional view taken along the line 4—4 in FIG. 3.

Carried by each bracket is an elongated shaft or jackscrew 48. Jackscrew 48 is free to rotate with respect to the bracket and slide relative thereto in the longitudinal direction. The jackscrew is further contained with respect to assembly 28 by a first (top) ramp 50. The ramp 50 is solid except for a longitudinal bore therethrough of a diameter slightly larger than that of the jackscrew. Thus, except for a small amount of rocking allowed by the loose fit between jackscrew 48 and first ramp 50, the jackscrew is limited to essentially rotation and longitudinal movement relative to the circuit card assembly. A flathead rivet 52 mounts ramp 50 to heat sink 30. The first ramp is not fixed to the heat sink but slides with respect thereto. As seen in FIG. 4, rivet 52 is contained relative to first ramp 50 in a groove 53 substantially conforming to the heat of the rivet and running longitudinally of jackscrew 48.

Contained on jackscrew 48 between first ramp 50 and bracket 42 are a second ramp 54, a third ramp 56, and a fourth ramp 58. Each of these intermediate ramps is formed of a highly heat conductive material, trapezoidal in shape and solid except for a generally central and longitudinal bore having a diameter larger than that of jackscrew 48, so as to allow movement of the ramps laterally with respect to the jackscrew. The bottom portion of screw 48 is threaded as shown at 60 to allow threaded engagement with opening 27 in each anchor 26.

At the top of jackscrew 48 is a head 62 having a hexagonal cavity 63 into which a hexagonal wrench can be inserted to rotate the jackscrew into opening 27. Head 62 is externally threaded for threaded engagement with an internally threaded crown 64. Crown 64 has a plurality of slots 65 by which it can be rotated with respect to head 62 and thus moved longitudinally relative to jackscrew 48.

Figure 5:
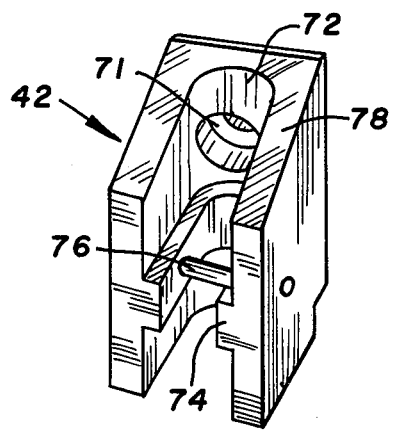
FIG. 5 is a perspective view of a bracket also shown in FIG. 1.

Jackscrew 48 is supported by the bracket at a neck 66 thereof having a diameter slightly smaller than the remainder of the jackscrew. An upper collar 68 above the neck and the lower collar 70 below the neck retain jackscrew 48 in bracket 42 while allowing limited longitudinal movement relative to the bracket. Bracket 42 is seen in more detail in FIG. 5. An opening 71 in the upper half of the bracket accommodates rivet 44, while an opening not shown similarly accommodates rivet 46. A longitudinally directed u-shaped cutout 72 runs the length of block 42. Projecting inwardly along the u-shaped cutout is a shoulder 74, itself defining a cutout somewhat smaller than cutout 72. A retaining pin 76 is mounted in bracket 42 and spans the gap between the shoulder ends.

Figure 3:
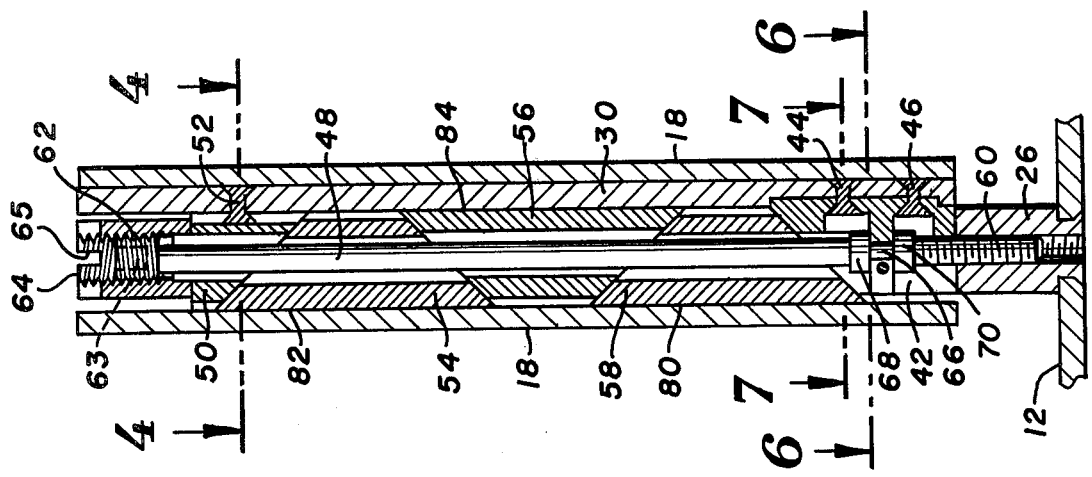
FIG. 3 is a sectional view taken along the line 3—3 in FIG. 2.
Figure 7:
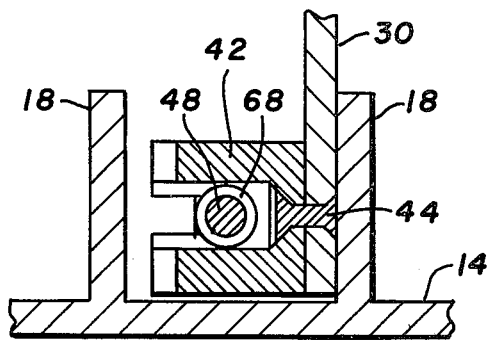
FIG. 7 is a sectional view taken along the line 7—7 in FIG. 3.
Figure 6:
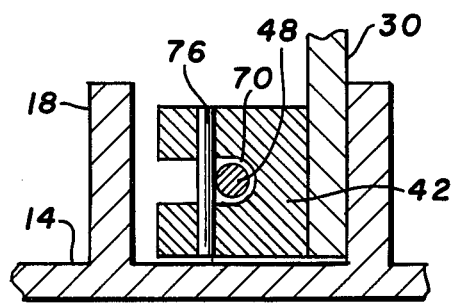
FIG. 6 is a sectional view taken along the line 6—6 in FIG. 3.

The support of jackscrew 48 within bracket 42 is perhaps best understood from FIGS. 3, 6, and 7. The diameter of upper collar 68 is just slightly less than the interior diameter of bracket 42, preventing any substantial movement of the collar laterally relative to the bracket. Likewise, lower collar 70 is approximately the size of the bore in bracket 42. The diameter of neck 66 is substantially less than the collar diameter. Yet, as seen in FIG. 6, retaining pin 76 is sufficiently close to neck 66 to prevent its lateral movement relative to the bracket. The abutment of upper collar 68 against shoulder 74 prevents further downward movement of jackscrew 48; likewise, lower collar 70 prevents further upward movement of the jackscrew when it abuts the bottom of shoulder 74. Consequently, jackscrew 48 is free to rotate and free to move longitudinally to a limited extent with respect to the bracket and circuit card assembly 28. However, it is restrained from any movement lateral to the bracket.

Such mounting structure enables jackscrew 48 and the other member of the jackscrew pair (not shown) to guide circuit card assembly 28 into electrical contact with chassis 10. When jackscrew 48 is initially inserted into opening 27 of anchor 26, and the jackscrew at the other end of circuit card assembly 28 is inserted into its associated anchor, the circuit board assembly is positioned with respect to the chassis so that its set of pin contacts 40 are aligned with the associated female contacts 24. The alignment is achieved with a high degree of accuracy due to the fact that no circuit card movement is permitted laterally of the jackscrews.

Ramps 50, 54, 56, and 58 are rigid members, preferably of a material with a high thermal conductance. They are solid except for a central bore of a diameter larger than the diameter of jackscrew 48, which permits some movement in each ramp transversely with respect to jackscrew 48, for example to the left or to the right as viewed in FIG. 3. Furthermore, mating surfaces between each pair of adjacent ramps and also between fourth ramp 58 and bracket 42, are parallel and oblique with respect to jackscrew 48. Each pair of oblique mating surfaces is slanted in the opposite direction from its neighboring pair of oblique mating surfaces. For example, the surfaces of first ramp 50 and second ramp 54 slant upward and to the left, while the lower surface of ramp 54 and the top surface of ramp 56 slant upward and to the right. In other words, the intermediate ramps are trapezoidal in cross section.

The significance of the trapezoidal shape in ramps 54, 56, and 58 lies in the manner in which they react to a compressive force applied longitudinally of jackscrew 48. Such a force resolves itself into two perpendicular components at each interface or pair of mating surfaces between adjacent ramps: a component perpendicular to the surfaces, and a component parallel to the surfaces which causes a slippage between surfaces such that each trapezoid is moved in the direction of its largest longitudinal surface. Consequently, as viewed in FIG. 3, a compressive force longitudinally along the jack screw urges second ramp 54 to the left, urges third ramp 56 to the right, and, finally, urges fourth ramp 58 to the left. As the weight of the ramps accounts for some longitudinal compressive force, gravity alone causes the slippage above described. Thus, even without any compressive force a longitudinal surface 80 of ramp 58 and a longitudinal surface 82 of ramp 54 are both be urged against rib 18, while a longitudinal surface 84 of ramp 56 is urged against heat sink 30.

To apply further compressive force on the ramps, crown 64 is turned downward on head 62, thus moving it against first ramp 50, driving it and the other ramps toward bracket 42. As the ramps can travel no further longitudinally, they move laterally, adjacent ramps moving in opposite directions relative to one another. It has been found that the force due to crown 64 against ramp 50 can provide a compressive force on the order of one hundred times as great as that of gravity. The clamping force of surfaces 82 and 80 against rib 18, and heat sink 30 (as urged by ramp 56) against the opposite rib 18, is similarly on the order of a one hundred fold increase over the force due to gravity alone, and securely anchors circuit card assembly 28 with respect to chassis 10.

In order to mount the circuit card assembly on the chassis, it is first positioned so that jackscrew 48 of first fastened 32 is inserted into the opening 27 of one of anchors 26, while the jackscrew contained in second fastener 34 is similarly inserted into the anchor opening at the opposite end of the selected connector housing 22. With the jackscrews so inserted, housing 38 and its pin contacts 40 are aligned with housing 22 and its female contacts 24, although the contacts do not yet touch one another. The jackscrews are then simultaneously turned into the respective anchor openings. The simultaneous threading insures that the pins are inserted evenly with a substantially constant insertion force across the row of pin contacts, and it further supplies the necessary force required for insertion of the pins. Such force can be sustantial when the number of pins exceeds one hundred. The jackscrews are simultaneously turned with the aid of hexagonal wrenches until the bottom of bracket 42 abuts the top of its associated anchor 27, and the opposed bracket and anchor are similarly in contact. At this point, complete electrical contact is established between pins 40 and female contacts 24. However, the spacing between housings 22 and 38 is such that bracket to anchor abutment occurs before any possible damage to the pins from overinsertion.

Figure 8:
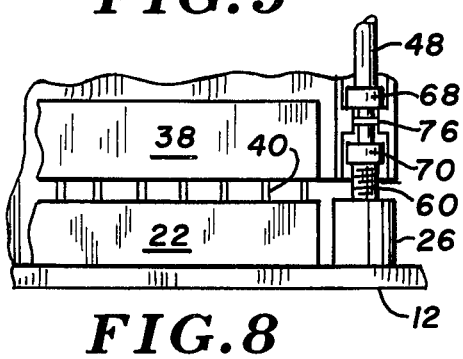
FIG. 8 is an elevational view showing a portion of FIG. 1 with the circuit card partially inserted into the chassis.

FIG. 8 shows an intermediate location following initial insertion of the pins 40 into their respective female contacts, yet before total engagement. Collar 68 is in contiguous surface contact with the top of shoulder 74; in fact, the total force required for insertion of pins 40 is resolved between collar 68 and shoulder 74, avoiding undue stress to the more delicate parts of the mounting assembly. For example, retaining pin 76 bears none of the direct insertion force as it merely prevents lateral or transverse movement of the jackscrew with respect to bracket 42.

Figure 2:
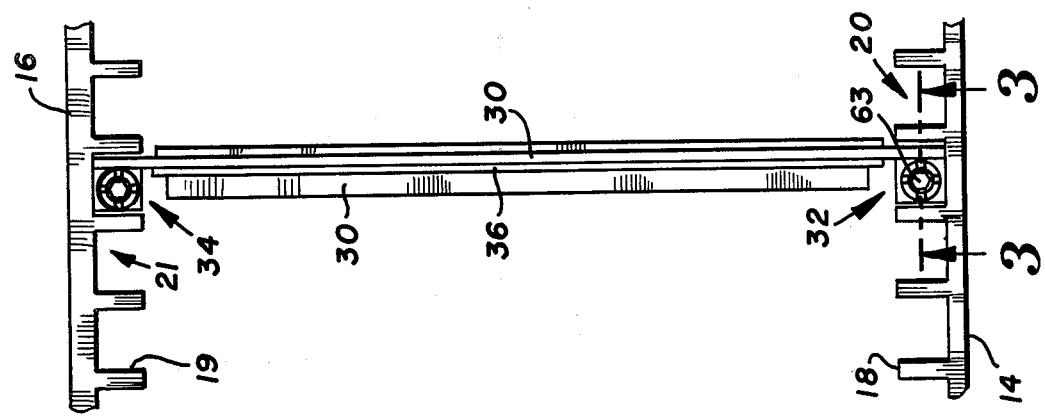
FIG. 2 is a top view of the chassis and circuit card.
Figure 9:
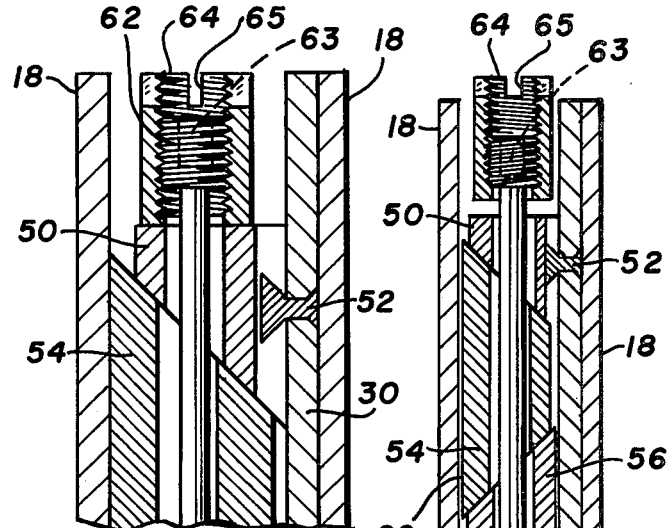
FIG. 9 is an enlarged partial view of FIG. 3 showing the circuit card fully inserted into the chassis.
Figures 10, 11:
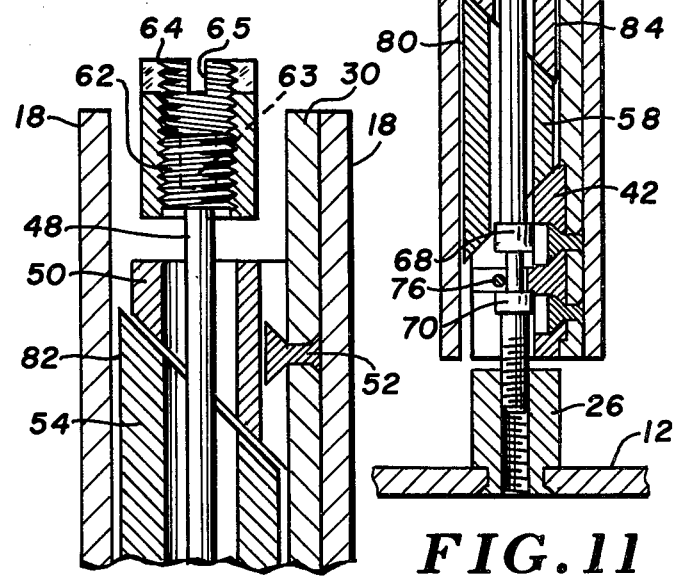
FIG. 10 is a view similar to that in FIG. 9 but with the circuit card only partially inserted into the chassis.
FIG. 11 is a sectional view similar to that in FIG. 3 but with the circuit card partially removed from the chassis.

FIG. 10 shows an intermediate stage of the circuit card assembly mounting in which complete electrical contact is established. Jackscrew 48 has been rotated downward and is prevented from further downward rotation due to the abutment of bracket 42 against anchor 26. Crown 64 is not in contact with top ramp 50, and for this reason, the outward force of the mounting assembly against the opposed channel wall portions is due primarily to the weight of the ramps themselves. The final stage of the mounting involves the turning of crown 64 downward on jackscrew 48. A tool, e.g., an ordinary screwdriver (not shown), is insertable into slots 65 of crown 64 to rotate crown 64 clockwise as viewed in FIG. 2 from its position in FIG. 10 to a clamping position shown in FIG. 9. In the clamping position, crown 64 firmly abuts first ramp 50 and has driven ramp 50 slightly downward and toward bracket 42. Due to crown 54, a longitudinal compressive force is resolved through all ramps, tending to drive adjacent ramps in opposite directions laterally of jackscrew 48. The pressure drives surfaces 80 and 82 against rib 18, and further drives surface 86 against heat sink 30, in turn forcing heat sink 30 against the opposite rib 18. The fully mounted position is shown in FIG. 3. In addition to the frictional anchoring of circuit card assembly 28, surfaces 80, 82, and 86 provide a relatively large area of contact between the heat sink and ribs, whereby a substantial amount of heat can be dissipated from the circuit card to the walls of chassis 10.

The dismounting of circuit card assembly 28 is essentially the reverse of its mounting. First, crown 64 is rotated counterclockwise (as viewed in FIG. 2) to relieve the compressive force on ramps 50, 54, 56, and 58. Once the ramps are free, the jackscrews can be retracted from their associated anchors. As is shown in FIG. 11, the requisite force for removing the circuit card assembly is resolved at the contact area between lower collar 70 and the bottom surface of shoulder 74. As was the case with mounting of the circuit card, the force required in dismounting (to overcome the friction between pins 40 and their associated female contacts) is resolved between the comparatively substantial shoulder and collar surfaces, and thus the more delicate surfaces such as pin 76 are not subjected to undue stress.

It is seen that the disclosed fasteners provide a means for initially positioning the circuit card with respect to the chassis such that the electrical contact pins and mating female contacts are accurately aligned with one another. Furthermore, they provide a positive means of overcoming the resistance to insertion of the pins, mainly due to friction. Finally, the crown provides a separate forcing means on the ramps which, when applied to the ramps, causes them to move transversely outward of the screw in opposite directions, firmly anchoring the circuit card assembly between opposite channel walls in the chassis. This anchoring permits use of the circuit module in aviation, space exploration and other areas in which a module is subjected to a severe environment.

We claim:

1. Apparatus removably mounting a printed circuit card assembly to a chassis; said chassis including a base, two opposed walls, means defining a plurality of channels in said walls, a row of female electrical contacts mounted to the base, and an anchoring means for anchoring at least one shaft, said anchoring means mounted to the base proximate each end of said row; said printed circuit card assembly including a heat sink, a printed circuit card mounted to the heat sink, a mating row of pin contacts mounted to said assembly and adapted to engage said female contacts thereby establishing electrical contact between said chassis and circuit card, and a bracket mounted to said assembly proximate each end of said mating row; wherein the improvement comprises:
an elongated shaft carried in each bracket and releasably engageable with said anchoring means, contact between each shaft and said anchoring means, prior to full engagement therewith, aligning said pin contacts with said female contacts whereby subsequent movement of each shaft to full engagement with said anchoring means simultaneously causes said pin contacts and female contacts to engage; a plurality of ramps carried on each shaft and moveable laterally thereof; and a forcing means, mounted on each shaft and moveable longitudinally thereof, for urging the ramps laterally outward in opposite directions, thereby urging at least one of said ramps and said assembly against opposite wall portions of one of said channels to frictionally secure the assembly in said chassis.

2. The apparatus of claim 1 wherein:
each shaft is fully engaged with its associated anchoring means when its associated bracket contacts said anchoring means.

3. The apparatus of claim 2 wherein:
each bracket has a shoulder and each shaft has two collars, one on each side of said shoulder, each coller adapted to abut said shoulder to limit longitudinal movement of said shaft with respect to said bracket.

4. The apparatus of claim 1 wherein:
said ramps are solid, rigid and relatively thermally conductive, each having an internal longitudinal bore of a diameter greater than the diameter of said shaft.

5. The apparatus of claim 4 wherein:
said forcing means includes a crown threadedly engaged with said shaft, said ramps positioned between the crown and the bracket, adjacent ramps having oblique and parallel mating surfaces whereby movement of said crown against its adjacent ramp and further toward said bracket causes said ramps to move laterally of said shaft, adjacent ramps moving in opposite lateral directions relative to one another.

6. Apparatus removably mounting a circuit card assembly to a chassis including a base and a wall having a plurality of parallel, upstanding ribs defining at least one channel, said apparatus including:
a bracket mounted to said assembly, an elongated shaft carried in the bracket and releasably engageable with an anchoring means mounted to the chassis, a plurality of ramps carried on said shaft and moveable laterally thereof; and a forcing means mounted on the shaft and moveable longitudinally thereof for urging the ramps laterally outward in opposite directions, thereby urging at least one of said ramps and said assembly against opposite upstanding ribs of said channel.

7. The apparatus of claim 6 wherein:
said chassis includes a row of female electrical contacts mounted to the base, and said circuit card assembly includes a mating row of pin contacts adapted to engage said female contacts thereby to establish electrical contact between the chassis and circuit card, contact between said shaft and said anchoring means, prior to full engagement therewith, aligning said pin contacts with said female contacts whereby subsequent movement of the shaft to full engagement with the anchoring means causes said pin contacts and female contacts to engage.

8. The apparatus of claim 7 wherein:
said shaft is fully engaged with said anchoring means when said bracket contacts said anchoring means.

9. The apparatus of claim 8 wherein:
said bracket includes a shoulder and said shaft includes a collar on each side of said shoulder, each collar adapted to abut said shoulder thereby to limit longitudinal movement of said shaft relative to said bracket.

10. The apparatus of claim 6 wherein: said ramps are solid, rigid and highly thermally conductive, each ramp having an internal longitudinal bore of a diameter greater than the diameter of said shaft.

11. The apparatus of claim 10 wherein:
said forcing means includes a crown threadedly engaged with said shaft, said ramps positioned between the crown and bracket, adjacent ramps having oblique and parallel mating surfaces, movement of said crown toward said bracket after contact with its adjacent ramp causing said ramps to move laterally of said shaft, adjacent ramps moving in opposite lateral directions relative to one another.

* * * * *